US009875948B2

United States Patent
Lu et al.

(10) Patent No.: US 9,875,948 B2
(45) Date of Patent: Jan. 23, 2018

(54) PACKAGE WAFER PROCESSING METHOD

(71) Applicant: DISCO CORPORATION, Tokyo (JP)

(72) Inventors: Xin Lu, Tokyo (JP); Makoto Tanaka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/412,807

(22) Filed: Jan. 23, 2017

(65) Prior Publication Data

US 2017/0213774 A1 Jul. 27, 2017

(30) Foreign Application Priority Data

Jan. 22, 2016 (JP) .................................. 2016-010993

(51) Int. Cl.
| | |
|---|---|
| H01L 21/66 | (2006.01) |
| B23K 26/364 | (2014.01) |
| H01L 21/68 | (2006.01) |
| B23K 26/03 | (2006.01) |
| H01L 21/67 | (2006.01) |
| H01L 23/544 | (2006.01) |
| H01L 21/78 | (2006.01) |

(52) U.S. Cl.
CPC ............ *H01L 22/26* (2013.01); *B23K 26/032* (2013.01); *B23K 26/364* (2015.10); *H01L 21/67092* (2013.01); *H01L 21/681* (2013.01); *H01L 21/78* (2013.01); *H01L 23/544* (2013.01); *H01L 2223/54426* (2013.01)

(58) Field of Classification Search
None
See application file for complete search history.

(56) References Cited

U.S. PATENT DOCUMENTS

| | | | | |
|---|---|---|---|---|
| 2002/0025616 A1* | 2/2002 | Kamigaki | ............ | B23D 59/001 438/200 |
| 2009/0197351 A1* | 8/2009 | Morikazu | .............. | B23K 26/03 438/5 |
| 2016/0284612 A1* | 9/2016 | Shirai | ..................... | H01L 22/20 |
| 2017/0221780 A1* | 8/2017 | Tanaka | .................... | H01L 22/12 |

FOREIGN PATENT DOCUMENTS

| | | | |
|---|---|---|---|
| JP | 2009170501 A | * | 7/2009 |
| JP | 2012028635 A | * | 2/2012 |
| JP | 2013-074021 | | 4/2013 |
| JP | 2013-171990 | | 9/2013 |

* cited by examiner

*Primary Examiner* — Mary Wilczewski
*Assistant Examiner* — Erik T Peterson
(74) *Attorney, Agent, or Firm* — Greer Burns & Crain, Ltd.

(57) ABSTRACT

A package wafer processing method includes a processing step of processing a package wafer along planned dividing lines by a laser beam irradiation unit and forming processing grooves in the package wafer. The processing step includes detecting a processing groove and an exposed key pattern closest to the planned dividing line corresponding to the processing groove at a predetermined timing and measuring, as a deviation amount, the difference between the distance from the processing groove to the exposed key pattern and the distance that is registered in a registration step and is from the planned dividing line corresponding to the processing groove to the closest key pattern. An indexing feed mechanism is corrected according to the deviation amount.

2 Claims, 5 Drawing Sheets

PACKAGE WAFER PROCESSING METHOD

BACKGROUND OF THE INVENTION

Field of the Invention

The present invention relates to a processing method for a package wafer whose front surface side is sealed by a resin.

Description of the Related Art

In recent years, the wafer level chip size package (WL-CSP), which is carried out to packaging in the wafer state, has been attracting attention. In the WL-CSP, a redistribution layer and electrodes are provided and are sealed by a resin or the like on the front surface side of devices formed on a wafer, and the wafer after the sealing (WL-CSP substrate) is divided by a method such as laser processing. This WL-CSP is useful for size reduction of the package because the size of the chip obtained by the dividing is directly the size of the package.

By the way, when the laser processing of the wafer is carried out, alignment to adjust the position, orientation, and so forth of the wafer is carried out normally on the basis of a characteristic key pattern in the device. On the other hand, in the above-described WL-CSP substrate, many devices are covered by a resin or the like and the number of exposed key patterns is small. For this reason, in the existing method, there is a problem that an operator needs to select the key pattern to be used and it takes a long time to carry out the alignment.

To address this problem, there have been proposed a method in which solder balls or the like that are exposed on the upper surface of a resin and function as electrodes are used as a target pattern (for example, refer to Japanese Patent Laid-open No. 2013-171990), a method in which the intersection of a planned dividing line exposed at the outer circumferential part of a package wafer and the outer circumferential edge is used as the basis (for example, refer to Japanese Patent Laid-open No. 2013-74021), and so forth. According to these methods, alignment can be carried out in a short time even with a package wafer like a WL-CSP substrate in which the number of exposed key patterns is small.

SUMMARY OF THE INVENTION

However, the shape, size, and so forth of the solder balls used in the above-described methods have individual difference. Furthermore, the intersection of the planned dividing line and the outer circumferential edge is not necessarily clear. For this reason, there is a problem that it is impossible to realize alignment with high accuracy and the processing accuracy of the package wafer becomes low in the above-described methods.

Accordingly, an object of the present invention is to provide a package wafer processing method that can keep the accuracy of processing high and shorten the time it takes to carry out the processing.

In accordance with an aspect of the present invention, there is provided a package wafer processing method in which a package wafer is processed by using a processing apparatus including a holding table that is rotatable and holds the package wafer in which devices having key patterns are formed in regions defined by a plurality of planned dividing lines that are formed on a front surface and intersect and a region excluding an outer circumferential part of the front surface is sealed by a resin, a laser beam irradiation unit that carries out irradiation with a pulse laser beam having such a wavelength as to be absorbed by the package wafer held by the holding table, a processing feed mechanism that carries out processing feed of the holding table and the laser beam irradiation unit relatively in an X-axis direction, an indexing feed mechanism that carries out indexing feed of the holding table and the laser beam irradiation unit relatively in a Y-axis direction perpendicular to the X-axis direction, an imaging unit that images and detects a region to be processed in the package wafer, and a control unit that controls each constituent element. The package wafer processing method includes a registration step of registering, in the control unit, key pattern position information indicating the position of the key pattern, distance information indicating the distances from the key pattern to the planned dividing lines that are closest, interval information indicating the interval between two adjacent planned dividing lines, and resin-sealed region position information indicating the position of a resin-sealed region sealed by the resin, and figuring out the positions of exposed key patterns that are the key patterns exposed outside the resin-sealed region from the key pattern position information, the distance information, the interval information, and the resin-sealed region position information and registering the positions of the exposed key patterns in the control unit, an alignment step of, after the registration step, imaging and detecting a plurality of exposed key patterns of the package wafer held by the holding table by the imaging unit and adjusting the orientation of the planned dividing lines to set the orientation parallel to the X-axis direction by using the exposed key patterns that are detected, and a processing step of, after the alignment step, processing the package wafer held by the holding table along the planned dividing lines by the laser beam irradiation unit and forming processing grooves in the package wafer. The processing step includes a deviation amount measurement step of imaging and detecting the processing groove and the exposed key pattern closest to the planned dividing line corresponding to the processing groove at a predetermined timing and measuring, as a deviation amount, difference between the distance from the processing groove to the exposed key pattern and the distance that is registered in the registration step and is from the planned dividing line corresponding to the processing groove to the key pattern that is closest, a correction step of correcting the feed amount of the indexing feed mechanism according to the deviation amount, and an indexing feed step of carrying out indexing feed of the holding table and the laser beam irradiation unit relatively with the feed amount corrected in the correction step.

In the one aspect of the present invention, the processing groove formed in the resin may be imaged and detected in the deviation amount measurement step.

In the package wafer processing method according to the one aspect of the present invention, the orientation of the planned dividing lines is adjusted to be parallel to the X-axis direction by utilizing the exposed key patterns exposed in the region outside the resin-sealed region of the package wafer. Thus, alignment of the package wafer can be carried out with high accuracy. Furthermore, from the key pattern position information indicating the position of at least one key pattern, the distance information indicating the distances from the key pattern to the closest planned dividing lines, the interval information indicating the interval between two adjacent planned dividing lines, and the resin-sealed region position information indicating the position of the resin-sealed region, the positions of the exposed key patterns exposed in the region outside the resin-sealed region are figured out to be used for the alignment. Therefore, the alignment of the package wafer can be carried out in a short time compared with the case in which an operator selects and finds the key patterns to be used, or the like. Moreover, the feed amount of indexing feed (feed amount of the indexing feed mechanism) is corrected in the processing step by utilizing the exposed key patterns. Thus, the processing accuracy of the package wafer can be kept high. In addition, the feed amount of indexing feed can be corrected by properly using a small number of exposed key patterns. Thus, stop of the processing due to an error such as failure in finding the key pattern also does not occur. As above, according to the one aspect of the present invention, a package wafer processing method that can keep the accuracy of processing high and shorten the time it takes to carry out the processing can be provided.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described with reference to the accompanying drawings. A package wafer processing method according to the present embodiment includes a registration step, an alignment step (see FIG. 3A), and a processing step (see FIG. 3B). The processing step further includes a deviation amount measurement step (see FIG. 4), a correction step (see FIG. 4), and an indexing feed step (corrected indexing feed step).

In the registration step, based on design information and so forth of a package wafer as the processing target, various kinds of information necessary for processing of the package wafer are registered in a control unit of a processing apparatus. Specifically, key pattern position information indicating the position of a key pattern, distance information indicating the distances from the key pattern to the closest planned dividing lines (streets), interval information indicating the interval between two adjacent planned dividing lines, and resin-sealed region position information indicating the position of a resin-sealed region sealed by a resin are registered. Furthermore, from these pieces of information, the positions of key patterns exposed in the region outside the resin-sealed region (exposed key patterns) are figured out and are registered in the control unit. In the alignment step, first the package wafer is held by a holding table of the processing apparatus. Then, based on the exposed key pattern that is imaged and detected, the orientation of the package wafer is adjusted to make the orientation of the planned dividing lines become parallel to the X-axis direction (processing feed direction). In the processing step, irradiation with a laser beam is carried out along the planned dividing line to form a processing groove in the package wafer.

In the deviation amount measurement step, the formed processing groove and the exposed key pattern closest to the planned dividing line corresponding to this processing groove are imaged and detected at an arbitrary timing. Then, the difference between the distance from the detected processing groove to the closest exposed key pattern and the distance from the planned dividing line corresponding to this processing groove to the closest key pattern is calculated as the deviation amount of indexing feed. The distance from the planned dividing line to the closest key pattern is calculated based on the distance information registered in the registration step. In the correction step, the feed amount of indexing feed to relatively move a laser beam irradiation unit that carries out irradiation with the laser beam and the holding table in the Y-axis direction (indexing feed direction) is corrected according to the calculated deviation amount. In the indexing feed step (corrected indexing feed step), the laser beam irradiation unit and the holding table are relatively moved (indexing feed) with the feed amount corrected in the correction step. After the indexing feed step, the processing of the package wafer is continued with the original feed amount (feed amount before correction). The package wafer processing method according to the present embodiment will be described in detail below.

Figure 1:
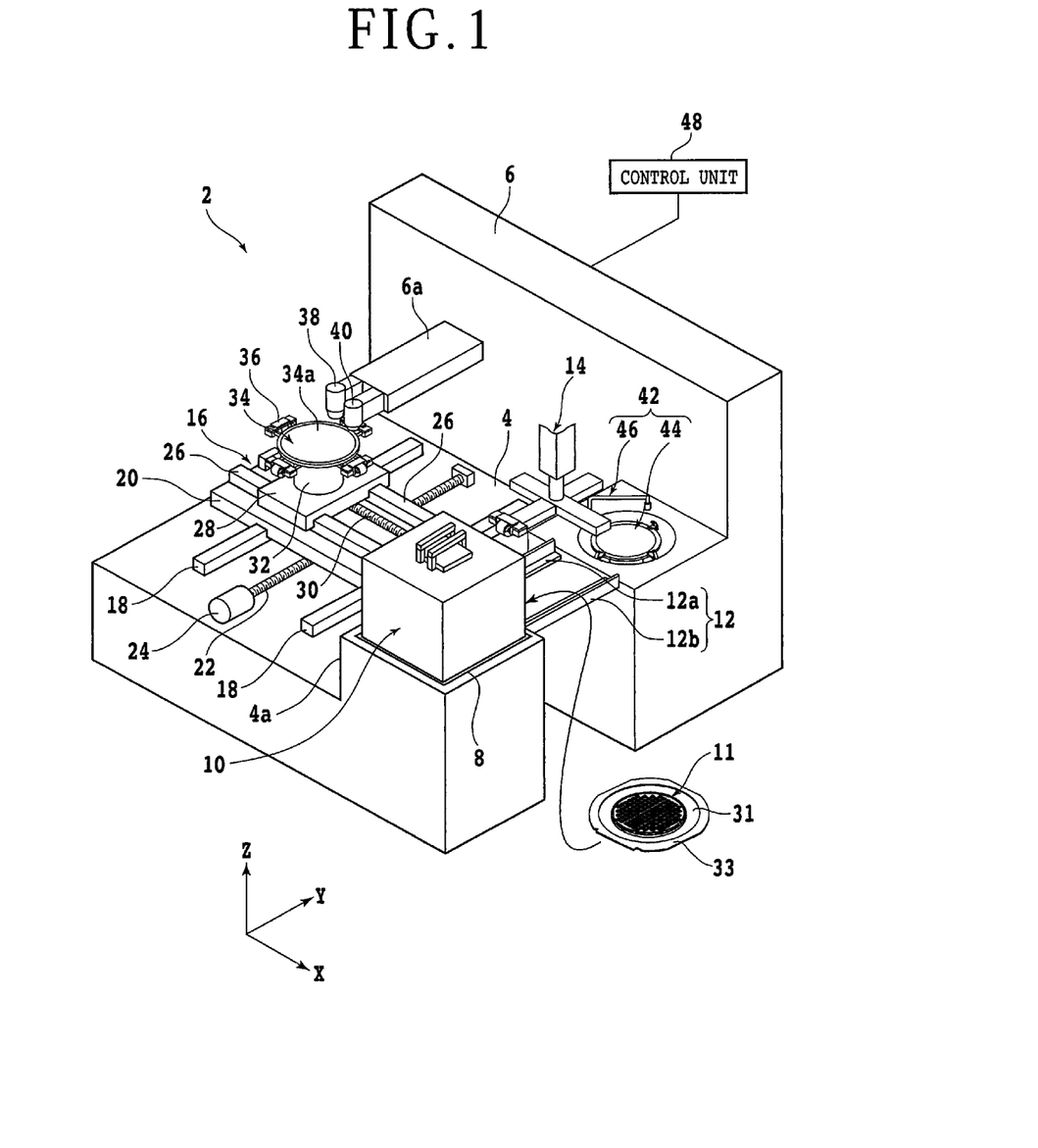
FIG. 1 is a perspective view schematically illustrating a configuration example of a processing apparatus with which a package wafer processing method according to an embodiment of the present invention is carried out.

First, a processing apparatus with which the package wafer processing method according to the present embodiment is carried out will be described. FIG. 1 is a perspective view schematically illustrating a configuration example of the processing apparatus with which the package wafer processing method according to the present embodiment is carried out. As illustrated in FIG. 1, the processing apparatus (laser processing apparatus) 2 includes a base 4 that supports the respective structures. A support structure 6 extending in the Z-axis direction (vertical direction or height direction) is provided at the rear end part of the base 4. A protruding part 4a that protrudes upward is provided at a corner part on the front side of the base 4 separate from the support structure 6. A space is formed inside the protruding part 4a and a cassette elevator 8 that can move up and down is set in this space. A cassette 10 in which plural package wafers 11 can be housed is placed on the upper surface of the cassette elevator 8.

Figure 2A:
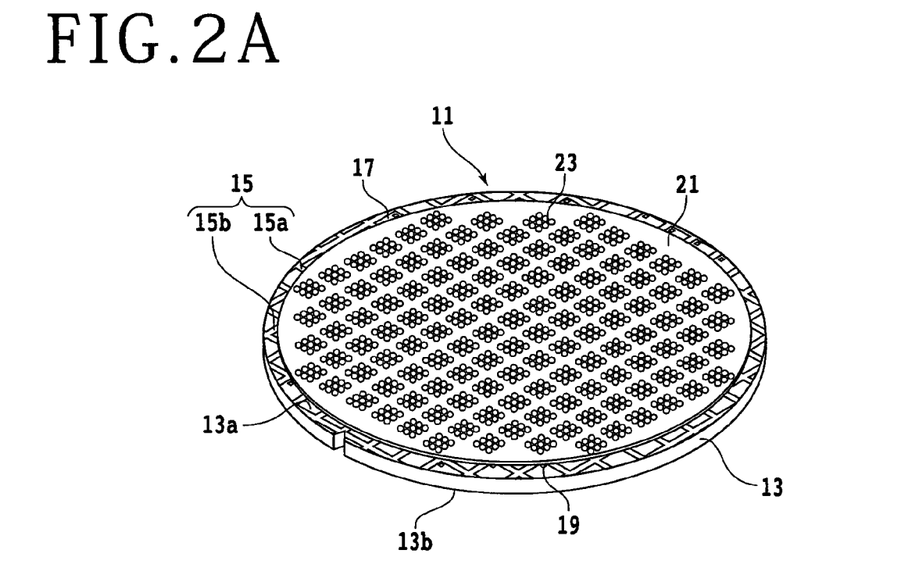
FIG. 2A is a perspective view schematically illustrating a configuration example of a package wafer.
Figure 2B:
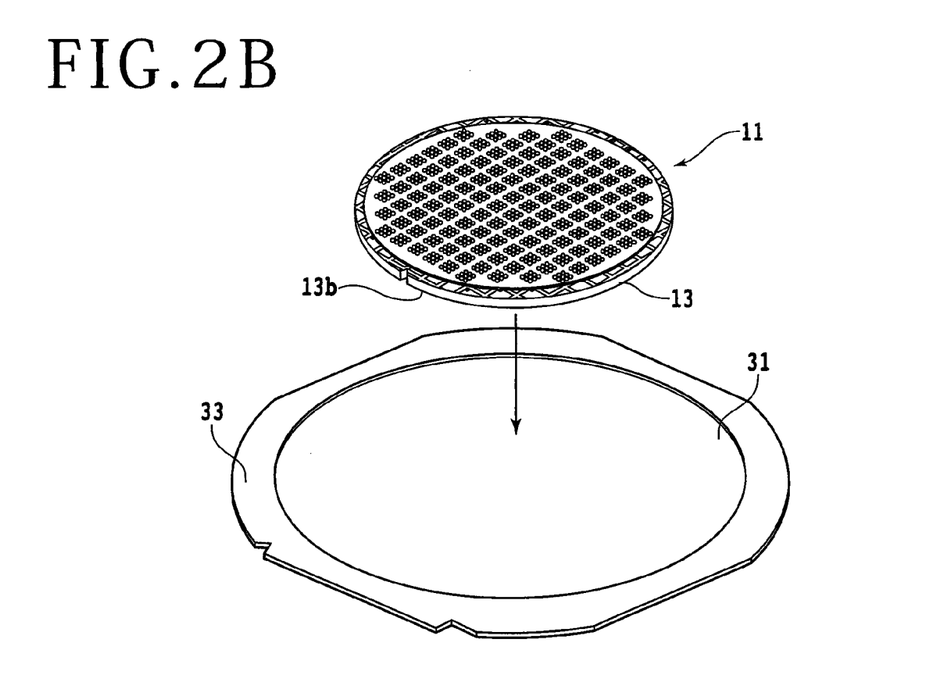
FIG. 2B is a perspective view schematically illustrating how the package wafer is supported by a ring-shaped frame.

FIG. 2A is a perspective view schematically illustrating a configuration example of the package wafer 11 and FIG. 2B is a perspective view schematically illustrating how the package wafer 11 is supported by a ring-shaped frame. As illustrated in FIGS. 2A and 2B, the package wafer 11 includes a wafer 13 that has a circular disc shape and is composed of a material such as silicon (Si), gallium arsenide (GaAs), lithium tantalate (LiTaO$_3$), lithium niobate (LiNbO$_3$), silicon carbide (SiC), or sapphire (Al$_2$O$_3$). A front surface 13a of the wafer 13 is segmented into plural regions by plural planned dividing lines (streets) 15 that intersect each other, and a device 17 such as an integrated circuit (IC), a surface acoustic wave (SAW) filter, or a light emitting diode (LED) is formed in each region. Furthermore, a key pattern 19 having a characteristic shape is included in each device 17. That is, the plural key patterns 19 are arranged on the front surface 13a of the wafer 13.

The planned dividing lines 15 include plural first planned dividing lines 15a extending in a first direction and plural second planned dividing lines 15b extending in a second direction perpendicular to the first direction. An interval d1 between two adjacent first planned dividing lines 15a (see FIG. 3A) and an interval d2 between two adjacent second planned dividing lines 15b (see FIG. 3A) are each substantially constant. The interval between two adjacent key patterns 19 is also equal to the interval between two adjacent planned dividing lines 15 and is the interval d1 or the interval d2. A region (central part) excluding the vicinity of the circumferential edge (outer circumferential part) in the front surface 13a of the wafer 13 is sealed by a resin 21. In this region, the planned dividing lines 15, the devices 17, and the key patterns 19 are not exposed. In contrast, the vicinity of the circumferential edge of the front surface 13a is not covered by the resin 21 and part of the planned dividing lines 15, the devices 17, and the key patterns 19 is exposed. Plural electrodes 23 formed by a material such as a solder are disposed at positions corresponding to the respective devices 17 on the upper surface of the resin 21.

As illustrated in FIG. 2B, a dicing tape (adhesive tape) 31 having a larger diameter than the package wafer (wafer 13) is stuck to the back surface side of the package wafer 11 (side of a back surface 13b of the wafer 13). Furthermore, a ring-shaped frame 33 is fixed to the outer circumferential part of the dicing tape 31. Due to this, the package wafer 11 is supported by the ring-shaped frame 33 with the intermediary of the dicing tape 31.

In a processing apparatus 2, a temporary placement mechanism 12 on which to temporarily place the above-described package wafer 11 is provided at a position adjacent to the protruding part 4a. The temporary placement mechanism 12 includes a pair of guide rails 12a and 12b made to get closer to and farther away from each other, with the guide rails 12a and 12b kept parallel to the Y-axis direction (indexing feed direction of the processing apparatus 2). The respective guide rails 12a and 12b each include a support surface to support the package wafer 11 (frame 33) and a side surface perpendicular to the support surface and clamp the package wafer 11 (frame 33) drawn from the cassette 10 by a conveying unit 14 in the X-axis direction (processing feed direction of the processing apparatus 2) to align the package wafer 11 at a predetermined position.

A movement mechanism (processing feed mechanism or indexing feed mechanism) 16 is provided at the center of the base 4. The movement mechanism 16 includes a pair of Y-axis guide rails 18 that are disposed on the upper surface of the base 4 and are parallel to the Y-axis direction. A Y-axis movement table 20 is slidably attached to the Y-axis guide rails 18. A nut part (not illustrated) is provided on the back surface side (lower surface side) of the Y-axis movement table 20 and a Y-axis ball screw 22 parallel to the Y-axis guide rails 18 is screwed to this nut part. A Y-axis pulse motor 24 is joined to one end part of the Y-axis ball screw 22. When the Y-axis ball screw 22 is rotated by the Y-axis pulse motor 24, the Y-axis movement table 20 moves in the Y-axis direction along the Y-axis guide rails 18.

A pair of X-axis guide rails 26 parallel to the X-axis direction are provided on the front surface (upper surface) of the Y-axis movement table 20. An X-axis movement table 28 is slidably attached to the X-axis guide rails 26. A nut part (not illustrated) is provided on the back surface side (lower surface side) of the X-axis movement table 28 and an X-axis ball screw 30 parallel to the X-axis guide rails 26 is screwed to this nut part. An X-axis pulse motor (not illustrated) is joined to one end part of the X-axis ball screw 30. When the X-axis ball screw 30 is rotated by the X-axis pulse motor, the X-axis movement table 28 moves in the X-axis direction along the X-axis guide rails 26.

A table base 32 is provided on the front surface side (upper surface side) of the X-axis movement table 28. Over the table base 32, a holding table (chuck table) 34 that sucks and holds the package wafer 11 is disposed. Four clamps 36 that fix, from four sides, the ring-shaped frame 33 that supports the package wafer 11 are set around the holding table 34. The holding table 34 is joined to a rotational drive source (not illustrated) such as a motor and rotates around a rotation axis substantially parallel to the Z-axis direction (vertical direction or height direction). When the X-axis movement table 28 is moved in the X-axis direction by the above-described movement mechanism 16, processing feed of the holding table 34 is carried out in the X-axis direction. Furthermore, when the Y-axis movement table 20 is moved in the Y-axis direction by the movement mechanism 16, indexing feed of the holding table 34 is carried out in the Y-axis direction. The upper surface of the holding table 34 is a holding surface 34a that holds the package wafer 11. This holding surface 34a is formed substantially parallel to the X-axis direction and the Y-axis direction and is connected to a suction source (not illustrated) via a flow path (not illustrated) and so forth formed inside the holding table 34 and the table base 32.

The support structure 6 is provided with a support arm 6a that protrudes from a surface (front surface) and a laser beam irradiation unit 38 that irradiates a laser beam downward is disposed at the tip part of this support arm 6a. Furthermore, a camera (imaging unit) 40 that images the upper surface side of the package wafer 11 (side of the front surface 13a) is set at a position adjacent to the laser beam irradiation unit 38. The laser beam irradiation unit 38 includes a laser oscillator (not illustrated) that carries out pulse oscillation of a laser beam having such a wavelength as to be absorbed by the package wafer 11. For example, if the package wafer 11 includes the wafer 13 composed of a semiconductor material such as silicon, a laser oscillator that carries out pulse oscillation of a laser beam whose wavelength is 355 nm by using a laser medium such as Nd:YAG, or the like, can be used. Furthermore, the laser beam irradiation unit 38 includes a light collector that collects the laser beam (pulse laser beam) pulse-oscillated from the laser oscillator, and irradiates and collects this laser beam for the package wafer 11 held by the holding table 34. By causing processing feed of the holding table 34 in the X-axis direction while carrying out irradiation with the laser beam by the laser beam irradiation unit 38, laser processing (ablation processing) of the package wafer 11 can be carried out along the X-axis direction to form a processing groove.

The package wafer 11 after the processing is conveyed from the holding table 34 to a cleaning unit 42 by the conveying unit 14, for example. The cleaning unit 42 includes a spinner table 44 that sucks and holds the package wafer 11 in a cleaning space having a cylindrical shape. A rotational drive source (not illustrated) that rotates the spinner table 44 at a predetermined speed is joined to the lower part of the spinner table 44. Above the spinner table 44, an injection nozzle 46 that injects a fluid for cleaning (typically, two-fluid obtained by mixing water and air) toward the package wafer 11 is disposed. The package wafer 11 can be cleaned by rotating the spinner table 44 that holds the package wafer 11 and injecting the fluid for cleaning from the injection nozzle 46. For example, the package wafer 11 cleaned by the cleaning unit 42 is placed on the temporary placement mechanism 12 by the conveying unit 14 and is housed into the cassette 10.

Constituent elements such as the conveying unit 14, the movement mechanism 16, the holding table 34, the laser beam irradiation unit 38, and the camera 40 are each connected to a control unit 48. This control unit 48 controls the above-described respective constituent elements according to the series of steps necessary for the processing of the package wafer 11.

Next, the package wafer processing method carried out in the above-described processing apparatus 2 will be described. In the package wafer processing method according to the present embodiment, first the registration step of registering the information necessary for the processing of the package wafer 11 in the control unit 48 is carried out. Specifically, a memory (not illustrated) of the control unit 48 is made to store the key pattern position information indicating the position of the key pattern 19 of the package wafer 11, the distance information indicating the distances from the key pattern 19 to the closest planned dividing lines 15 (closest first planned dividing line 15a and closest second planned dividing line 15b), the interval information indicating the interval between two adjacent planned dividing lines 15, and the resin-sealed region position information indicating the position of the resin-sealed region sealed by the resin 21.

The key pattern position information is coordinate information indicating the position of the key pattern 19. It suffices that the coordinate information relating to at least one key pattern 19 is included in this key pattern position information. The interval information is equivalent to the interval d1 between two adjacent first planned dividing lines 15a and the interval d2 between two adjacent second planned dividing lines 15b. The resin-sealed region position information is coordinate information indicating the outer edge of the resin-sealed region covered by the resin 21, for example. The resin 21 is formed into a substantially true circle shape by using a mold or the like and therefore it is also possible to use information relating to the diameter (or radius) of the resin 21 as the resin-sealed region position information. The key pattern position information, the distance information, the interval information, and the resin-sealed region position information are derived from design information of the package wafer 11 or the like.

When the key pattern position information, the distance information, the interval information, and the resin-sealed region position information are stored in the memory, the control unit 48 figures out the positions of the key patterns 19 exposed in the region outside the resin-sealed region (exposed key patterns) based on these pieces of information. Specifically, first, from the key pattern position information, the distance information, the interval information, and so forth, the control unit 48 obtains the positions (coordinate information) of all key patterns 19 including the key patterns 19 that are covered by the resin 21 and are not exposed. The key patterns 19 are regularly arranged at the interval d1 or the interval d2 as described above. Thus, the control unit 48 can obtain the positions of all key patterns 19 from the key pattern position information, the distance information, the interval information, and so forth. After obtaining the positions of all key patterns 19, the control unit 48 determines, regarding each key pattern 19, whether or not the position of the key pattern 19 exists outside the outer edge of the resin-sealed region represented by the resin-sealed region position information. The coordinate information of the key patterns 19 determined to exist outside the outer edge of the resin-sealed region is stored in the memory of the control unit 48 as exposed key pattern position information indicating the positions of the key patterns 19 that are not covered by the resin 21 (exposed key patterns).

After the registration step, the series of steps for processing the package wafer 11 is started. First, the alignment step of causing the holding table 34 to hold the package wafer 11 and adjusting the orientation of the package wafer 11 to make the orientation of the planned dividing lines 15 become parallel to the X-axis direction is carried out. Specifically, the package wafer 11 as the processing target is conveyed by the conveying unit 14 and is placed on the holding table 34, with the side of the resin 21 (side of the front surface 13a) exposed upward. Next, a negative pressure of the suction source is caused to act to suck and hold the package wafer 11 by the holding table 34.

After the package wafer 11 is sucked and held by the holding table 34, the upper surface side of the package wafer 11 (side of the front surface 13a) is imaged by the camera 40. Next, based on the formed taken image and the exposed key pattern position information, for example, two key patterns 19 (exposed key patterns) that correspond to the predetermined planned dividing line 15 and are exposed at the outer circumferential part of the package wafer 11 are detected. The package wafer 11 is placed on the holding table 34 by the conveying unit 14 with position and orientation in a predetermined acceptable error range. Thus, the target key patterns 19 (exposed key patterns) can be detected in a short time by imaging the vicinity of the coordinates indicated by the exposed key pattern position information and examining the taken image.

Figure 3A:
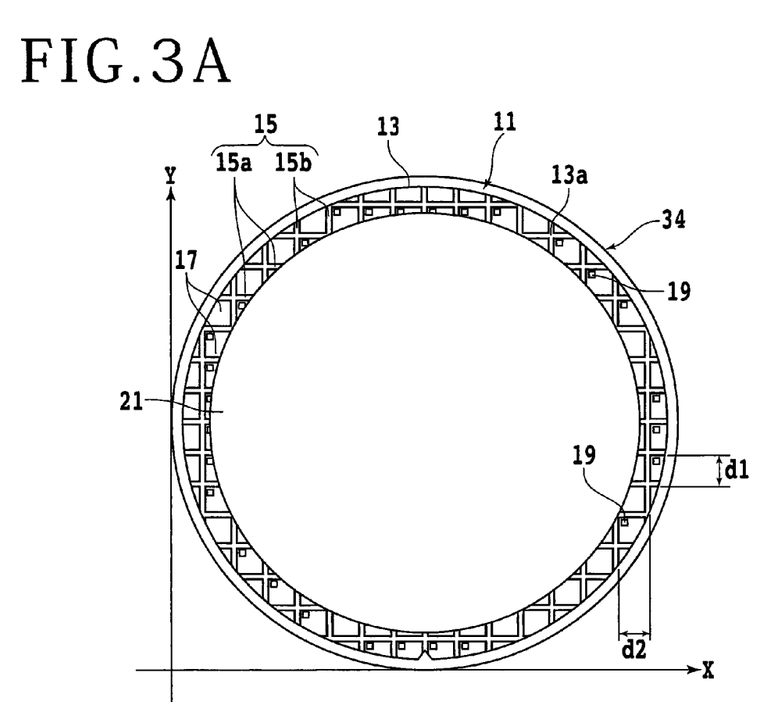
FIG. 3A is a plan view schematically illustrating the state of the package wafer after an alignment step.

Next, the actual coordinates of the detected key patterns 19 are figured out from the taken image and the orientation of the planned dividing lines 15 is adjusted to be parallel to the X-axis direction (processing feed direction) based on the figured-out coordinate information. Specifically, a proper rotation angle is set based on the figured-out real coordinates of the key patterns 19 and the holding table 34 is rotated. FIG. 3A is a plan view schematically illustrating the state of the package wafer 11 after the alignment step. In FIG. 3A, part of constituent elements of the package wafer 11 and so forth is omitted.

Figure 3B:
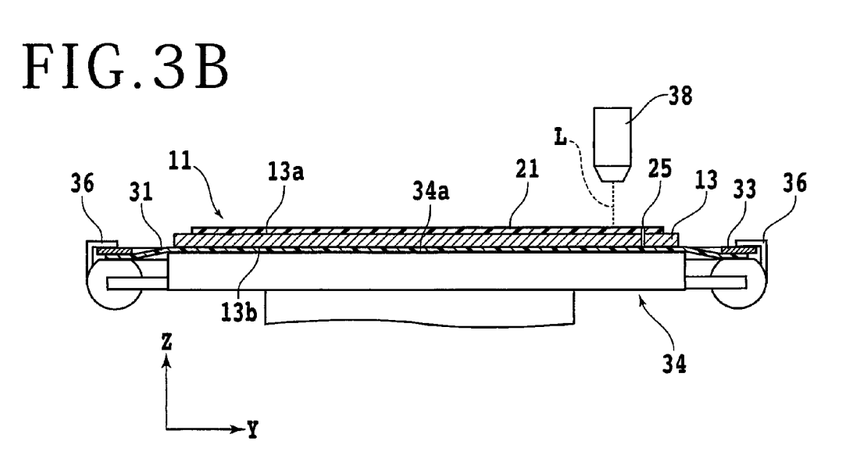
FIG. 3B is a partially-sectional side view schematically illustrating how the package wafer is irradiated with a laser beam in a processing step.

After the alignment step, the processing step of carrying out irradiation with a laser beam (pulse laser beam) along the planned dividing line 15 to process the package wafer 11 is carried out. FIG. 3B is a partially-sectional side view schematically illustrating how the package wafer 11 is irradiated with the laser beam in the processing step. Specifically, first the holding table 34 is moved and rotated so that the laser beam irradiation unit 38 may be disposed on an extension line of the target planned dividing line 15. Next, processing feed of the holding table 34 is carried out in the X-axis direction while a laser beam L is irradiated from the laser beam irradiation unit 38. This can process the package wafer 11 by the laser beam L to form a processing groove 25 along the target planned dividing line 15. After the processing groove 25 is formed in the target planned dividing line 15, indexing feed of the holding table 34 is carried out in the Y-axis direction and the laser beam irradiation unit 38 is disposed on an extension line of the adjacent planned dividing line 15. Then, processing feed of the holding table 34 is carried out in the X-axis direction while the laser beam L is irradiated, so that the processing groove 25 along this planned dividing line 15 is formed. In the processing step, such operation is repeated and thereby the processing grooves 25 along the respective planned dividing lines 15 are formed. Here, the feed amount of the holding table 34 (feed amount of indexing feed or feed amount of the movement mechanism (indexing feed mechanism) 16) is made to correspond to the interval between two adjacent planned dividing lines 15. Specifically, in the case of processing the package wafer 11 along the above-described first planned dividing lines 15a, a feed amount corresponding to the interval d1 is set. Furthermore, in the case of processing the package wafer 11 along the above-described second planned dividing lines 15b, a feed amount corresponding to the interval d2 is set.

By the way, in the above-described processing step, the position of the laser beam irradiation unit 38 after indexing feed often deviates from an extension line of the planned dividing line 15 due to variation in the actual feed amount attributed to generated heat or the like or due to the expansion or contraction of the resin 21 of the package wafer 11. When the position of the laser beam irradiation unit 38 deviates as above, it becomes impossible to keep the processing accuracy of the package wafer 11. Accordingly, in the package wafer processing method according to the present embodiment, the deviation amount measurement step and the correction step are carried out at an arbitrary timing in the processing step and the feed amount of indexing feed (feed amount of the movement mechanism (indexing feed mechanism) 16) is corrected. Due to this, indexing feed of the holding table 34 is carried out with the feed amount corrected in the correction step in the subsequent indexing feed step, so that the processing accuracy of the package wafer 11 can be kept.

Figure 4:
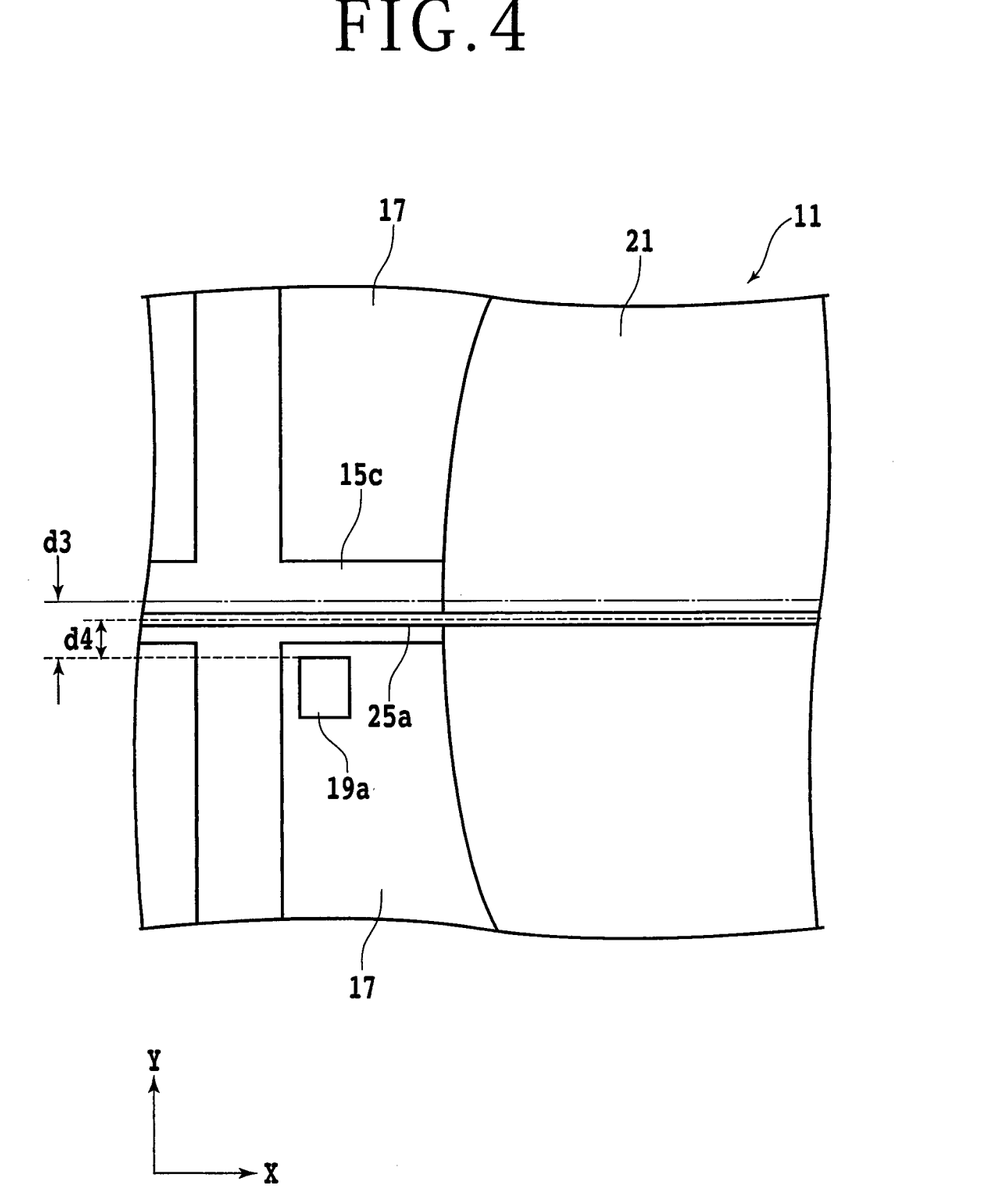
FIG. 4 is a plan view schematically illustrating a deviation amount measurement step and a correction step.

FIG. 4 is a plan view schematically illustrating the deviation amount measurement step and the correction step. In the deviation amount measurement step, first the upper surface side of the package wafer 11 (side of the front surface 13a) is imaged by the camera 40. Next, based on the taken image, the exposed key pattern position information, and so forth, for example, a processing groove 25a formed along an arbitrary planned dividing line 15c and the closest key pattern 19a (exposed key pattern) of the planned dividing line 15c corresponding to the processing groove 25a are detected. In the present embodiment, the processing groove 25a formed in the resin 21 (i.e. processing groove 25a exposed on the resin 21) is imaged and detected. However, it is also possible to image and detect the processing groove 25a formed in the vicinity of the circumferential edge (outer circumferential part) of the wafer 13.

Moreover, distance d3 from the planned dividing line 15c to the closest key pattern 19a is calculated based on the above-described distance information. For example, this distance d3 is the distance from the center of the planned dividing line 15c in the width direction to the closest key pattern 19a. Furthermore, based on the taken image and so forth, distance d4 from the processing groove 25a to the closest key pattern 19a (exposed key pattern) is calculated. For example, this distance d4 is the distance from the center of the processing groove 25a in the width direction to the closest key pattern 19a. Next, difference d3−d4 (or d4−d3) between the distance d3 and the distance d4 is calculated and is stored in the memory as the deviation amount of indexing feed.

In the correction step, the feed amount of indexing feed is corrected according to the above-described deviation amount. Specifically, a correction amount equivalent to the above-described deviation amount is subtracted (or added) with respect to the already-set feed amount. The feed amount after the correction is stored in the memory.

After the deviation amount measurement step and the correction step, the indexing feed step (corrected indexing feed step) of carrying out indexing feed of the holding table 34 is carried out. In this indexing feed step, the indexing feed of the holding table 34 is carried out with the feed amount corrected in the correction step. This can align the laser beam irradiation unit 38 with the center of the planned dividing line 15 in the width direction and keep the processing accuracy of the package wafer 11 high. After the indexing feed step, the feed amount is returned to the original feed amount (feed amount before the correction) and the processing of the package wafer 11 is continued. That is, it suffices that the indexing feed with use of the feed amount after the correction (indexing feed step) is carried out one time per one time of the deviation amount measure step and the correction step.

As described above, in the package wafer processing method according to the present embodiment, the orientation of the planned dividing lines 15 is adjusted to be parallel to the X-axis direction by utilizing the key patterns 19 exposed in the region outside the resin-sealed region of the package wafer 11 (exposed key patterns). Thus, alignment of the package wafer 11 can be carried out with high accuracy. Furthermore, from the key pattern position information indicating the position of at least one key pattern 19, the distance information indicating the distances from the key pattern 19 to the closest planned dividing lines 15, the interval information indicating the interval between two adjacent planned dividing lines 15, and the resin-sealed region position information indicating the position of the resin-sealed region, the positions of the key patterns 19 exposed in the region outside the resin-sealed region (exposed key patterns) are figured out to be used for the alignment. Therefore, the alignment of the package wafer 11 can be carried out in a short time compared with the case in which an operator selects and finds the key patterns 19 to be used, or the like. Moreover, the feed amount of indexing feed (feed amount of the movement mechanism (indexing feed mechanism) 16) is corrected in the processing step by utilizing the key patterns 19 that are exposed (exposed key patterns). Thus, the processing accuracy of the package wafer 11 can be kept high. In addition, the feed amount of indexing feed can be corrected by properly using a small number of key patterns 19 that are exposed (exposed key patterns). Thus, stop of the processing due to an error such as failure in finding the key pattern 19 also does not occur. As above, according to the present embodiment, a package wafer processing method that can keep the accuracy of processing high and shorten the time it takes to carry out the processing can be provided.

The present invention is not limited to the description of the above embodiment and can be carried out with various changes. For example, in the alignment step in the above-described embodiment, two key patterns 19 (exposed key patterns) corresponding to the predetermined planned dividing line 15 are used. However, the present invention is not limited to this mode. For example, two key patterns 19 (exposed key patterns) each corresponding to a respective one of two different planned dividing lines 15 may be used.

Figure 5A:
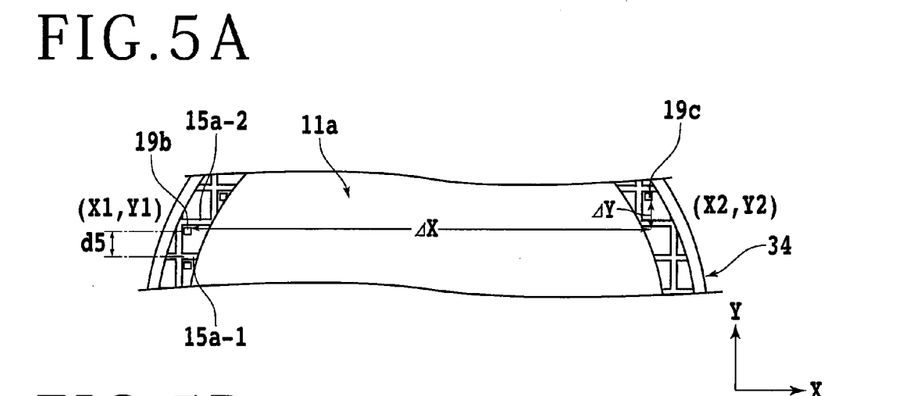
FIGS. 5A, 5B, and 5C are plan views schematically illustrating the alignment step in which two key patterns each corresponding to a respective one of two different planned dividing lines are used.
Figure 5B:
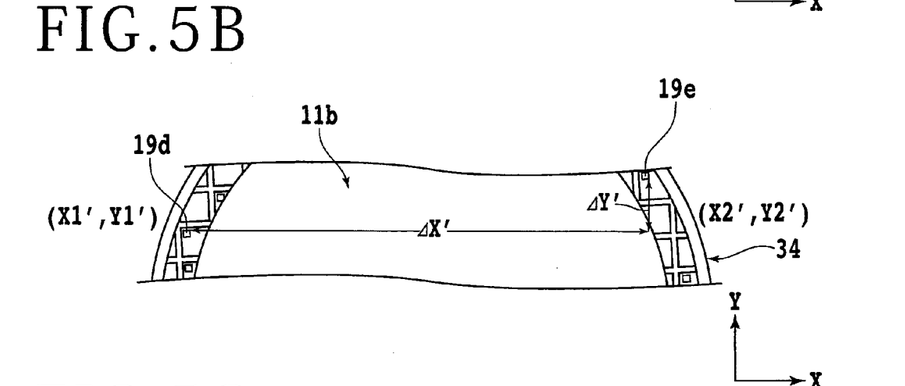
Figure 5C:
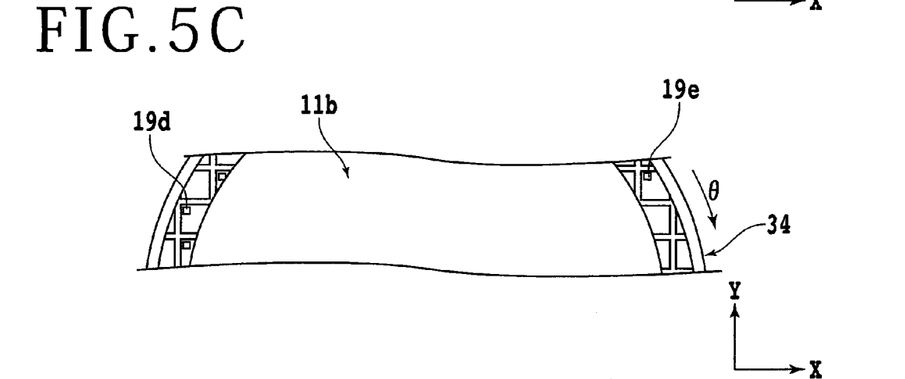

FIGS. 5A, 5B, and 5C are plan views schematically illustrating the alignment step in which two key patterns 19 each corresponding to a respective one of two different planned dividing lines 15 are used. In the alignment step according to this modification example, first a package wafer 11a for registration is conveyed by the conveying unit 14 and is placed on the holding table 34, with the side of the resin 21 (side of the front surface 13a) exposed upward.

Next, a negative pressure of the suction source is caused to act to suck and hold the package wafer 11a by the holding table 34. After the package wafer 11a is sucked and held by the holding table 34, the upper surface side of the package wafer 11a (side of the front surface 13a) is imaged by the camera 40. Next, based on the formed taken image, for example, the holding table 34 is rotated to make the first planned dividing lines 15a extending in a first direction become parallel to the X-axis direction and the orientation of the package wafer 11a is adjusted. Here, the rotation angle (rotation amount) of the holding table 34 is adjusted by the operator.

After the orientation of the package wafer 11a is adjusted, two exposed key patterns 19 corresponding to two different planned dividing lines 15 are selected in the outer circumferential part of the package wafer 11a. As illustrated in FIG. 5A, here a first key pattern 19b corresponding to a first planned dividing line 15a-1 and a second key pattern 19c corresponding to a first planned dividing line 15a-2 are selected. Then, the coordinates (X1, Y1) of the first key pattern 19b and the coordinates (X2, Y2) of the second key pattern 19c are registered in the control unit 48 as coordinate information. Furthermore, the positional relationship ($\Delta X$ (=X2−X1), $\Delta Y$ (=Y2−Y1)) between the coordinates (X1, Y1) of the first key pattern 19b and the coordinates (X2, Y2) of the second key pattern 19c is calculated and is registered in the control unit 48 as positional relationship information. Note that the distance from the first planned dividing line 15a-1 to the first key pattern 19b and the distance from the first planned dividing line 15a-2 to the second key pattern 19c are both d5. By the above process, the coordinate information and the positional relationship information necessary for the alignment (adjustment of the orientation of the package wafer 11) can be registered in the processing apparatus 2. It is preferable to select two key patterns 19 that are sufficiently separate in the X-axis direction, in which the first planned dividing lines 15a extend, as the first key pattern 19b and the second key pattern 19c. By selecting the two key patterns 19 sufficiently separate as above, the deviation of the package wafer 11 in the rotation direction of the holding table 34 becomes clear and thus it becomes easy to enhance the accuracy of the adjustment.

After the coordinate information and the positional relationship information are registered, a package wafer 11b as the processing target is conveyed by the conveying unit 14 and is placed on the holding table 34, with the side of the resin 21 (side of the front surface 13a) exposed upward. Next, a negative pressure of the suction source is caused to act to suck and hold the package wafer 11b by the holding table 34. After the package wafer 11b is sucked and held by the holding table 34, the upper surface side of the package wafer 11b (side of the front surface 13a) is imaged by the camera 40. Next, based on the formed taken image and the coordinate information registered in the control unit 48, a first key pattern 19d and a second key pattern 19e exposed at the outer circumferential part of the package wafer 11b are detected as illustrated in FIG. 5B. Because the package wafer 11b is placed on the holding table 34 by the conveying unit 14 with position and orientation in a predetermined acceptable error range, the first key pattern 19d and the second key pattern 19e of the package wafer 11b can be detected based on the coordinate information registered in the control unit 48 in advance.

Next, the positional relationship ($\Delta X'$ (=X2'−X1'), $\Delta Y'$ (=Y2'−Y1')) between the coordinates (X1', Y1') of the detected first key pattern 19d and the coordinates (X2', Y2') of the second key pattern 19e is calculated and is compared with the registered positional relationship information. Thereafter, the control unit 48 sets a rotation angle $\theta$ corresponding to the difference between the positional relationship ($\Delta X'$, $\Delta Y'$) and the positional relationship ($\Delta X$, $\Delta Y$) and rotates the holding table 34 as illustrated in FIG. 5C. Thereby, the first key pattern 19d moves from the coordinates (X1', Y1') to the coordinates (X1, Y1) and the second key pattern 19e moves from the coordinates (X2', Y2') to the coordinates (X2, Y2). That is, the orientation of the package wafer 11b is adjusted to make the first planned dividing lines 15a extending in the first direction become parallel to the X-axis direction. This adjustment is automatically carried out based on control of the control unit 48.

In this alignment step, the first key pattern 19b or 19d and the second key pattern 19c or 19e that each correspond to a respective one of two different first planned dividing lines 15a and are separate from each other are used. Therefore, the alignment can be carried out with high accuracy if at least two key patterns are exposed toward the upper surface side of the package wafer 11 (side of the front surface 13a). Here, the first planned dividing lines 15a extending in the first direction are adjusted to be parallel to the X-axis direction. However, it is also possible that the first planned dividing lines 15a extending in the first direction are adjusted to be parallel to the Y-axis direction by a similar method. Naturally, the second planned dividing lines 15b extending in a second direction may be adjusted to be parallel to the X-axis direction and the second planned dividing lines 15b extending in the second direction may be adjusted to be parallel to the Y-axis direction.

Furthermore, in this alignment step, the coordinates of the key patterns 19 may be expressed by using coordinate axes whose reference point is different for each package wafer 11. That is, the reference points of the coordinate axes representing the key patterns 19 do not need to correspond with each other between the package wafer for registration and the package wafer as the processing target. The reason why the coordinate axes with different reference points can be used as above is because the positional relationships ($\Delta X$, $\Delta Y$) and ($\Delta X'$, $\Delta Y'$) between two key patterns in the respective package wafers 11 do not depend on the reference point of the coordinate axes and are determined only by the relative position of the two key patterns. In this case, for example, the coordinates (A, B) of the package wafer for registration and the coordinates (A, B) of the package wafer as the processing target often represent different positions in coordinate axes having the rotation axis of the holding table 34 as a reference point (0, 0). In any case, it suffices that the coordinates of the key patterns 19 of the respective package wafers 11 can be used to calculate the positional relationships ($\Delta X$, $\Delta Y$) and ($\Delta X'$, $\Delta Y'$).

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A package wafer processing method in which a package wafer is processed by using a processing apparatus including:

a holding table that is rotatable and holds the package wafer in which devices having key patterns are formed in regions defined by a plurality of planned dividing lines that are formed on a front surface and intersect and a region excluding an outer circumferential part of the front surface is sealed by a resin, a laser beam irradiation unit that carries out irradiation with a pulse laser beam having such a wavelength as to be absorbed by the package wafer held by the holding table, a processing feed mechanism that carries out processing feed of the holding table and the laser beam irradiation unit relatively in an X-axis direction, an indexing feed mechanism that carries out indexing feed of the holding table and the laser beam irradiation unit relatively in a Y-axis direction perpendicular to the X-axis direction, an imaging unit that images and detects a region to be processed in the package wafer, and a control unit that controls each constituent element, the package wafer processing method comprising:

a registration step of registering, in the control unit, key pattern position information indicating a position of the key pattern, distance information indicating distances from the key pattern to the planned dividing lines that are closest, interval information indicating an interval between two adjacent planned dividing lines, and resin-sealed region position information indicating a position of a resin-sealed region sealed by the resin, and figuring out positions of exposed key patterns that are the key patterns exposed outside the resin-sealed region from the key pattern position information, the distance information, the interval information, and the resin-sealed region position information and registering the positions of the exposed key patterns in the control unit;

an alignment step of, after the registration step, imaging and detecting a plurality of exposed key patterns of the package wafer held by the holding table by the imaging unit and adjusting an orientation of the planned dividing lines to set the orientation parallel to the X-axis direction by using the exposed key patterns that are detected; and a processing step of, after the alignment step, processing the package wafer held by the holding table along the planned dividing lines by the laser beam irradiation unit and forming processing grooves in the package wafer, wherein:

the processing step includes:

a deviation amount measurement step of imaging and detecting the processing groove and the exposed key pattern closest to the planned dividing line corresponding to the processing groove at a predetermined time and measuring, as a deviation amount, difference between distance from the processing groove to the exposed key pattern and distance that is registered in the registration step and is from the planned dividing line corresponding to the processing groove to the key pattern that is closest, a correction step of correcting a feed amount of the indexing feed mechanism according to the deviation amount, and an indexing feed step of carrying out indexing feed of the holding table and the laser beam irradiation unit relatively with the feed amount corrected in the correction step.

2. The package wafer processing method according to claim 1, wherein:

the processing groove imaged and detected in the deviation amount measurement step is formed in the resin.

\* \* \* \* \*